(12) United States Patent
Schinkel et al.

(10) Patent No.: US 9,602,126 B2
(45) Date of Patent: Mar. 21, 2017

(54) SIGMA-DELTA ANALOG-TO-DIGITAL CONVERTER

(71) Applicant: Teledyne Dalsa B.V., Thousand Oaks, CA (US)

(72) Inventors: Daniel Schinkel, Enschede (NL); Wouter Groothedde, Enschede (NL)

(73) Assignee: TELEDYNE DALSA B.V., Eindhoven (NL)

( * ) Notice: Subject to any disclaimer, the term of this patent is extended or adjusted under 35 U.S.C. 154(b) by 0 days.

(21) Appl. No.: 14/654,432

(22) PCT Filed: Dec. 21, 2012

(86) PCT No.: PCT/EP2012/076814
§ 371 (c)(1),
(2) Date: Jun. 19, 2015

(87) PCT Pub. No.: WO2014/094913
PCT Pub. Date: Jun. 26, 2014

(65) Prior Publication Data
US 2015/0341046 A1    Nov. 26, 2015

(51) Int. Cl.
*H03F 3/45* (2006.01)
*H03M 3/00* (2006.01)
*H03F 3/181* (2006.01)

(52) U.S. Cl.
CPC ............ *H03M 3/464* (2013.01); *H03F 3/181* (2013.01); *H03M 3/438* (2013.01); *H03M 3/446* (2013.01); *H03F 3/45* (2013.01); *H03F 2200/03* (2013.01); *H03F 2200/331* (2013.01); *H03F 2203/45116* (2013.01); *H03F 2203/45138* (2013.01); *H03M 3/43* (2013.01)

(58) Field of Classification Search
CPC ...... H03M 3/464; H03M 3/438; H03M 3/446; H03M 3/43; H03F 3/181; H03F 2200/03; H03F 2200/331; H03F 2203/45116
USPC ........................................................ 330/69
See application file for complete search history.

(56) References Cited

U.S. PATENT DOCUMENTS

| 5,055,843 | A | 10/1991 | Ferguson, Jr. et al. |
| 7,042,377 | B2 | 5/2006 | Oliaei |
| 7,183,957 | B1 * | 2/2007 | Melanson ............... H03F 3/217 341/143 |
| 7,545,302 | B1 | 6/2009 | Silva et al. |
| 7,696,913 | B2 | 4/2010 | Melanson |
| 7,990,215 | B2 * | 8/2011 | Soenen ................. H03F 3/2173 330/10 |

(Continued)

OTHER PUBLICATIONS

International Search Report for PCT/EP2012/076814 dated Aug. 23, 2013 (3 pages).

(Continued)

*Primary Examiner* — Khanh V Nguyen
(74) *Attorney, Agent, or Firm* — K&L Gates LLP

(57) ABSTRACT

The present invention is related to a sigma-delta analog-to-digital converter (ADC). It further relates to a method for designing and manufacturing a sigma-delta ADC, and to a digital control loop comprising the same. According to the present invention, part of the filtering function required for noise-shaping is implemented in the feedback path. By suitably distributing the poles over the forward and feedback paths, stable operation can be achieved while offering low latency.

15 Claims, 9 Drawing Sheets

(56) References Cited

U.S. PATENT DOCUMENTS

2008/0278360 A1* 11/2008 Koli ................... H03H 17/0251
　　　　　　　　　　　　　　　　　　　　　　　　　341/143
2012/0010522 A1* 1/2012 Knudsen .............. H04R 25/505
　　　　　　　　　　　　　　　　　　　　　　　　　600/544

OTHER PUBLICATIONS

International Preliminary Report on Patentability for PCT/EP2012/076814 dated Dec. 17, 2014 (32 pages).
T.S. Doom, "An audio FIR-DAC in a BCD process for high Class-D amplifiers" Proceedings of ESSCIRC 2005.
B.M. Putter, "ΣΔ ADC with finite impulse response feedback DAC", ISSCC 2004 Dig. of Tech. Papers, pp. 76-77. Feb. 2004.
S.R. Norsworthy et.al., "Delta-sigma data converters: theory, design and simulation", John Wiley & Sons, 1996. Summary Only.
Gealow et.al, "A 2.8 mW ΔΣ ADC with 83 dB DR and 1.92 MHz BW using FIR outer feedback and TIA-based integrator", IEEE Symp. on VLSI Circuits, pp. 42-43, Jun. 15-17, 2011.

* cited by examiner

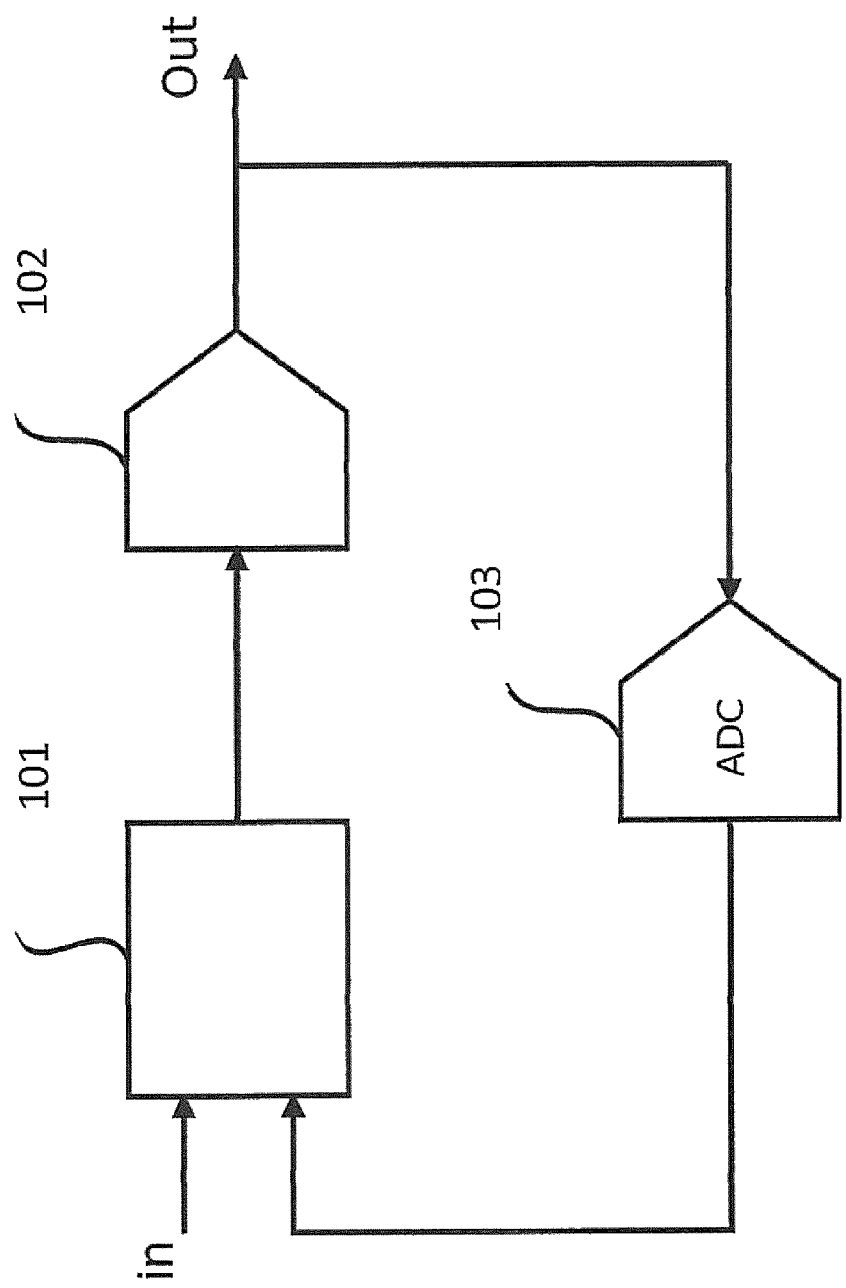

SIGMA-DELTA ANALOG-TO-DIGITAL CONVERTER

STATEMENT OF PRIORITY

This application is a U.S. national stage application, filed under 35 U.S.C. §371, of International Application Serial No. PCT/EP2012/076814, entitled "SIGMA-DELTA ANALOG-TO-DIGITAL CONVERTER," which was filed on Dec. 21, 2012, the disclosure of which is incorporated herein by reference in its entirety and for all purposes.

The present invention is related to a sigma-delta analog-to-digital converter (ADC). It further relates to a method for designing and manufacturing a sigma-delta ADC, and to a digital control loop comprising the same. An example of a digital control loop, to which the present invention particularly relates, is a digital audio amplifier.

A digital audio amplifier amplifies a digital input signal and drives one or more speakers for outputting the amplified signal.

Digital audio amplifiers may be based on a negative feedback control loop in which the analog output is first converted by an analog-to-digital converter (ADC) and then subsequently compared, at the input of the amplifier, with the original digital input signal. By using a high enough gain in the forward path, the analog signal at the output tracks the corresponding digital input. However, this can only be obtained if the latency of the ADC and its noise are kept at a minimum. Unstable operation may for instance occur if the latency is too high.

The conversion process performed by the ADC is susceptible to quantization noise. It is of key importance that the influence of this noise is kept away from the band of interest, typically ranging between 0 and 20 kHz. Sigma-delta ADCs are excellent candidates for fulfilling this need.

FIG. 1 illustrates a typical sigma-delta ADC known in the art. It comprises a filtering stage 1, a quantization stage 2, a feedback path including a digital-to-analog converter (DAC) 3, and a summing junction 4 at the input.

At the output of the sigma-delta ADC a digital bit or word stream emerges. In case of a single bit ADC, in which a bit stream is outputted, the spacing between adjacent "1"'s in the bit stream is indicative of the amplitude of the analog input signal, e.g. a portion of the bit stream comprising only "1"'s relates to a high amplitude of the input signal. Due to the feedback used, the average value of the bit stream tracks the amplitude of the analog input signal. In case of a multi-bit ADC, more resolution is used to express the difference determined by the quantization stage. However, also for multi-bit ADCs, the time averaged signal at the output follows the amplitude of the analog input signal.

Filtering stage 1 is configured to keep track of the difference between the analog signal at the input and the DAC converted bit/word stream at the output. As a result, the signal content in the output bit/word stream is the same as the signal content in the analog input signal within the pass band of filtering stage 1. Filtering stage 1 can have low pass, high pass or band pass characteristics.

Filtering stage 1 can comprise an integrator for integrating the error between the input signal, which is normally an analog signal, and the output signal that is fed back via DAC 3. Multiple integrators may also be used for higher-order filtering.

Quantization stage 2 may comprise a clocked comparator, for instance a gated D latch 5 having its data input connected to the output of filtering stage 1. Whenever clock signal 6 is high, the output of latch 5 will be a digital "0" or "1" depending on the level of the output of integrator 1.

The process of quantization introduces quantization noise. One advantage of the sigma-delta ADC is that by use of oversampling the contribution of the quantization noise in the band of interest can be manipulated. In FIG. 1, oversampling can be achieved by using a high enough clock rate.

Another known technique to reduce the impact of noise is to employ a noise shaping technique in which a filter is used in the forward path. For instance, in higher order sigma-delta ADCs, multiple integrators are used to provide suitable low-pass filter characteristics to improve the signal-to-noise ratio.

A drawback of the known high order sigma-delta ADC is that, without complex additional circuitry, the use of multiple integrator stages inherently increases the latency of the converter. A trade-off therefore exists between obtaining a high signal-to-noise ratio and obtaining a low latency.

A further drawback of the known sigma-delta ADC is that the low resolution of the ADC, typically in the order of 1-5 bits, introduces a significant amount of quantization noise, which can only be removed using filtering. However, this filtering introduces latency.

An object of the present invention is to provide a different topology for sigma-delta ADCs which allows a lower latency to be obtained while maintaining or improving the signal-to-noise ratio compared to prior art sigma-delta ADCs.

This object is achieved with the sigma-delta ADC according to claim 1. According to the invention, the sigma-delta ADC comprises a forward path connected to an input of the sigma-delta ADC comprising a filtering stage and a quantization stage, the forward path having a transfer function $H_{ff}$. The converter further comprises a feedback path from an output of the forward path to the input of the sigma-delta ADC, wherein the feedback path comprises a DAC and a digital filter for converting the output of the forward path. The feedback path itself has a transfer function $H_{fb}$.

The sigma-delta ADC has a stable noise transfer function NTF(z) that is given by:

$$NTF = \frac{1}{1+H_{ff}H_{fb}} = \frac{1}{1+H}$$

wherein H is the loop transfer function. Hereinafter, H(z) will be referred to as H. Similar considerations apply to other transfer functions unless otherwise stated.

NTF is typically expressed as a rational function comprising the ratio of a numerator polynomial and a denominator polynomial. Zeros $z_z$ of the numerator polynomial are referred to as zero's, wherein, in case $abs(z_z)<1$, the zero is called a damped zero, and an undamped zero in other cases. Similarly, zeros $z_p$ of the denominator polynomial are referred to as poles, wherein, in case $abs(z_p)<1$, the pole is called a damped pole, and an undamped pole in other cases.

According to the invention, NTF has at least one damped zero, $H_{ff}$ comprises all the undamped poles of H, and $H_{fb}$ comprises at least one damped pole associated with one of said at least one damped zero. The skilled person will appreciate that the feedback or forward paths can be implemented in various ways given a particular transfer function.

The applicant has realized that latency can be improved by shifting part or all of the filtering function required for noise shaping to the feedback path. The increased risk of instability, caused by the adding filtering in the feedback path, is counteracted by the particular choice in NTF and how the different poles are distributed over the forward and feedback paths.

A zero in the NTF will transform into a pole for the loop transfer function. More in particular, a damped or undamped zero in NTF will become a damped or undamped pole in H, respectively. $H_{ff}$ comprises all the undamped poles of H, if any. $H_{fb}$ comprises at least one damped pole that corresponds to one of the at least one damped zero in the NTF. It further comprises the remaining zeros and poles that are not already implemented in $H_{ff}$. It may be efficient to realize only the high frequency poles in the feedback path because they can be realized more easily using FIR filters.

According to the invention, a substantial part of the filtering required for noise shaping is achieved in the feedback path. By distributing damped and undamped poles and zeros over the forward and feedback paths, stability of the ADC can be ensured.

The sigma-delta ADC may further comprise a correction filter connected to the output of the forward path. This correction filter preferably has a transfer function $H_{cor}$ substantially given by:

$$H_{cor} = \frac{1+H}{H_{ff}}$$

The correction filter may be advantageous to include to obtain an overall wideband unity gain transfer, thereby obtaining low latency at least in the band of interest. Preferably, the correction filter has low-pass characteristics.

When both $H_{ff}$ and $H_{fb}$ have low-pass characteristics, suitable noise shaping can be achieved for low frequency signals. However, $H_{ff}$ and $H_{fb}$ may have band-pass or high pass characteristics to provide an ADC that is adapted for other frequencies or frequency bands. Generally, by containing the signal band of interest within the pass-band of both $H_{ff}$ and $H_{fb}$, suitable noise-shaping can be achieved.

If the converter comprises a first order low-pass filter or characteristics thereof in both $H_{ff}$ and $H_{fb}$, second order noise shaping can be obtained. Compared to a converter with a second order low-pass filter realized in $H_{ff}$ only, latency will be less.

The feedback path may comprise a finite impulse response (FIR) digital filter that has an impulse response that approximates the impulse response associated with $H_{fb}$. Such filter can be combined with the DAC for forming a finite impulse response digital-to-analog converter (FIR-DAC), also known as a DAC with a semidigital reconstruction filter.

The filtering in the filtering stage can be achieved by one or more active filters such as the integrator(s). However, the filtering can additionally or alternatively be achieved with one or more passive filters. The sigma-delta ADC according to the invention allows for a relatively simple configuration of the forward path as a significant part of the required filtering is intentionally implemented in the feedback path. Such configuration could for instance comprise a single integrator in the filtering stage, which eases for example the linearity requirements.

According to a second aspect, the present invention provides a digital control loop. The loop comprises a forward path connected to an input of the digital control loop comprising an amplifier for amplifying a difference between a digital input signal and a second digital signal and for converting the amplified signal into an analog output signal. It additionally comprises a feedback path from an output of the forward path to the input of the digital control loop. The feedback path comprises the sigma-delta ADC as defined above for converting the analog output signal into the second digital signal.

According to a third aspect, the present invention provides a digital audio amplifier. The amplifier comprises the digital control loop as defined above for driving a speaker, when connected to the digital audio amplifier, in accordance with the digital input signal.

According to a fourth aspect, the present invention provides a method for designing the sigma-delta ADC as described above. According to the present invention, the method comprises the steps of defining a desired stable noise transfer function NTF(z) of the sigma-delta ADC that comprises at least one damped zero. Next, NTF(z) is translated into a loop transfer function H(z) of the sigma-delta ADC according to:

$$H = \frac{1}{NTF} - 1 = H_{ff} H_{fb}$$

Subsequently, poles and zeros of H are extracted and H is split into $H_{ff}$ and $H_{fb}$, wherein $H_{ff}$ comprises all the undamped poles of H, and wherein $H_{fb}$ comprises at least one damped pole associated with one of said at least one damped zero.

The method may further comprise approximating an impulse response associated with $H_{fb}$ with a finite impulse response, and implementing this finite impulse response with a finite impulse response (FIR) filter.

As described above, an output of the forward path may be corrected using the aforementioned correction filter connected to the output of the forward path.

According to a fifth aspect, the present invention provides a method for manufacturing a sigma-delta ADC. This method comprises designing the ADC as defined above and manufacturing the ADC according to the design of the ADC.

Next the invention will be described in more detail referring to the accompanying drawings, in which:

FIG. 1 illustrates a known sigma-delta ADC;

FIG. 2 schematically illustrates an embodiment of a sigma-delta ADC according to the present invention;

FIGS. 6A and 6B illustrate different applications of the sigma-delta ADC of the present invention.

Figure 1:
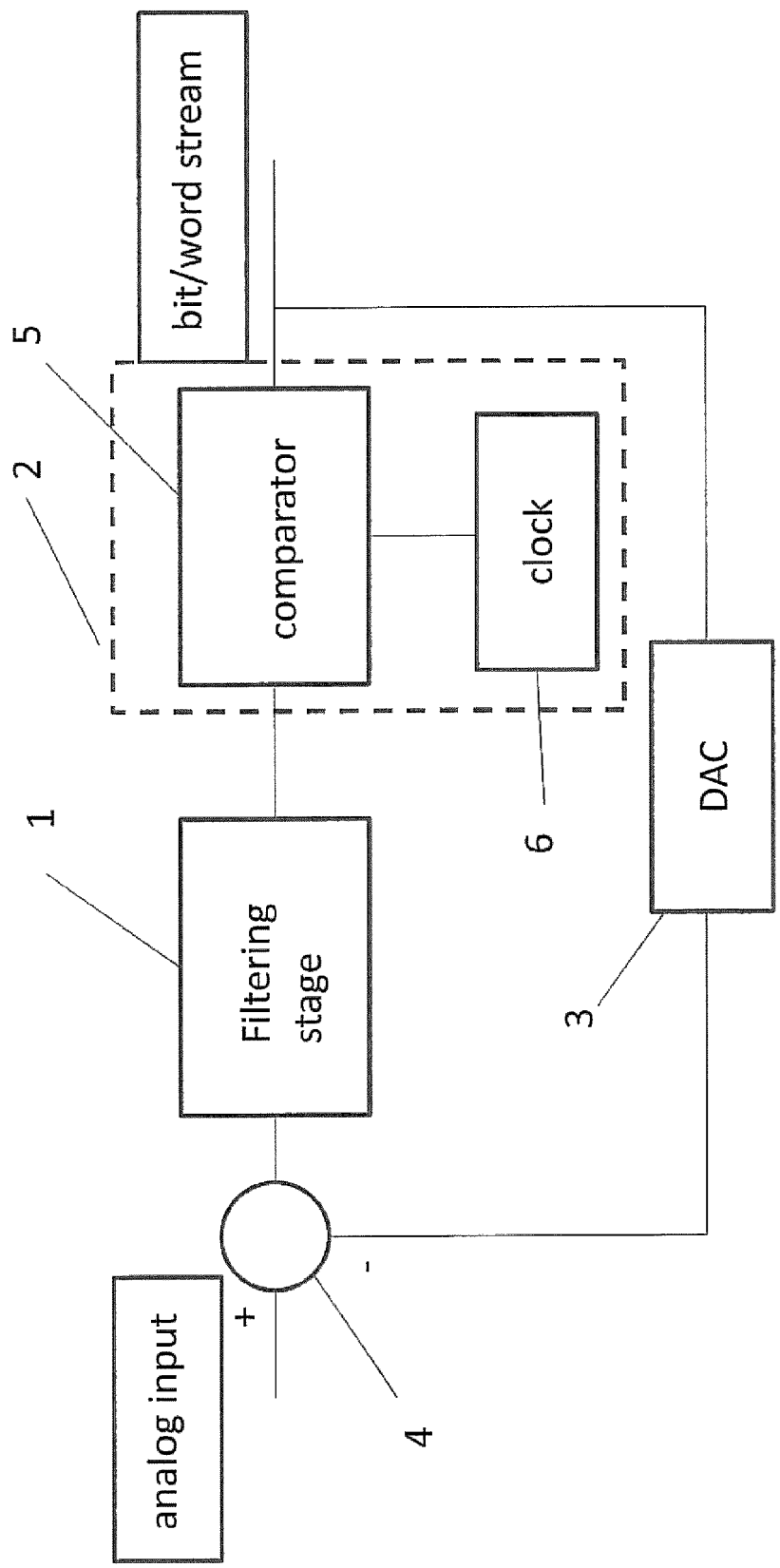
Figure 2:
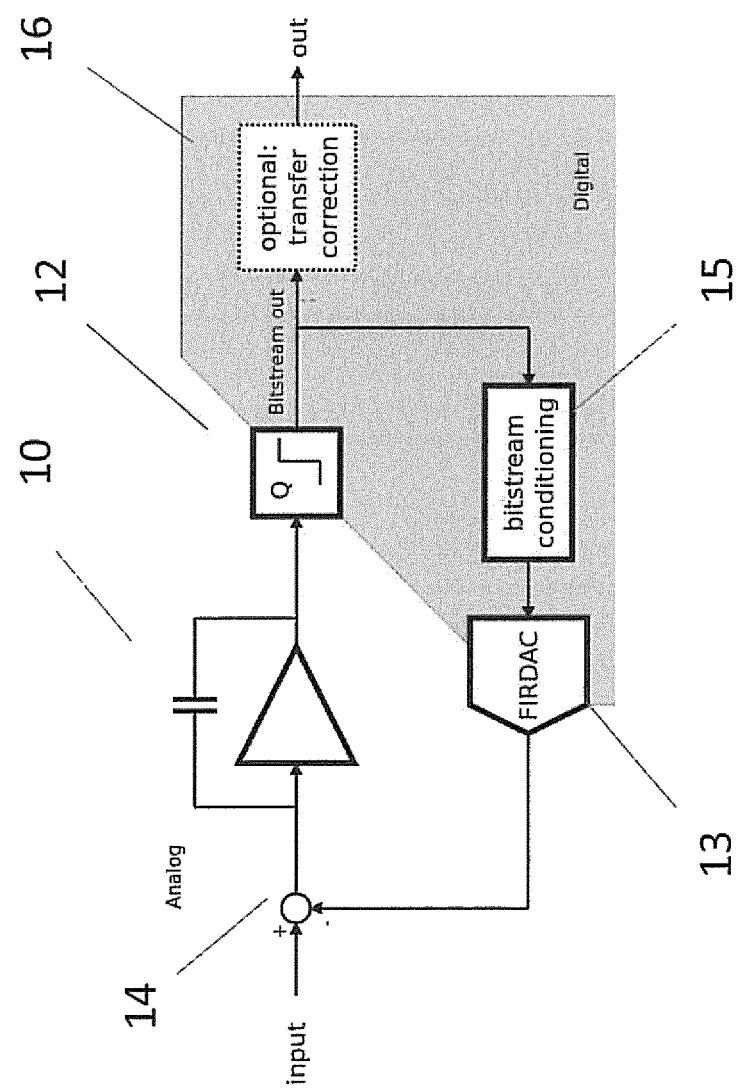

FIG. 2 schematically illustrates an embodiment of a sigma-delta ADC according to the present invention. The converter comprises an integrator 10, (or in other embodiments a filtering stage of higher or lower complexity), for integrating (processing) analog difference signals that are a difference function of the analog input signal and the analog feedback signal, a quantizer 12 responsive to the signals integrated by the integrator 10 (processed by the filtering stage) for producing the digital output signals at clock intervals defined by a clock signal, a bit stream conditioner 15 that manipulates the digital output in order to be suited input for a finite impulse response digital-to-analog converter (FIRDAC) 13, and optionally a correction filter 16 that equalizes the transfer characteristics of the ADC.

Although FIG. 2 illustrates a single bit converter, multi-bit converters outputting a word stream are not excluded.

FIRDACs are known as good DACs. FIRDACs are relatively simple one-bit DACs that behave like multi-bit converters. They are highly insensitive to mismatch, jitter, ISI and distortion and show high suppression of out-of-band-noise.

The filtering stage and/or integrator 10 takes care of that part of the filtering that is not or cannot be done in FIRDAC 13. To achieve good noise-shaping performance, the filtering stage and/or integrator should be of at least first-order and can be implemented with active and/or passive circuits.

FIRDAC 13 provides the conversion from digital-to-analog while at the same time providing a filter function specified by the finite impulse response filter (FIR-filter) coefficients. Since FIRDAC 13 features a filter function, this filter function is utilized to implement components of the required loop dynamics of the system.

Quantizer 12 converts the analog signal resulting from the filtering stage and/or integrator 10 in a digital representation at clock intervals defined by a clock signal. Quantizer 12 may comprise a clocked comparator.

Bit stream conditioner 15 takes the digital output of quantizer 12 and manipulates these in order to be suited for FIRDAC 13. Operations that could be performed inside this block are for example conversion to return-to-zero format in order to suppress inter-symbol-interference and negation in order to have both polarities of the output signal available.

Optional correction filter 16 could compensate for the signal transfer function of the ADC, thereby creating a unity gain transfer from input to output. This can be done without adding phase shift ensuring low latency of the ADC.

In sigma-delta data converter design, it is common practice to start with a desired noise-transfer function NTF and calculate the required filter function to implement this NTF. The present invention identified the filter function of the FIRDAC in the feedback path as a means to implement components of the overall required filter function. As such, the FIRDAC is related to part of NTF. According to the present invention, NTF is therefore chosen in such a way that it enables a FIRDAC as part of the filter.

In the prior art, filtering in the feedback path is not deliberately used for noise shaping. Instead, the feedback path in the known sigma-delta modulator is implemented such, that it would best represent the digital output code in analog form. As such, signal transfer functions in de DAC are normally designed to be as flat as possible and any deviation thereof, which would affect the signal transfer function STF, is considered unwanted and a serious risk with respect to stability of the entire system. Contrary to the prior art, the present invention identified the filter function of the FIRDAC, or other filtering means, in the feedback path as a possibility to implement components of the noise transfer function. The stability criteria still have to be maintained in order to end up with an ADC with stable behaviour. In order to come up with an optimal design in this new work space of utilizing filtering DACs while maintaining stability criteria in sigma-delta converters, a design procedure was developed, which is described next.

According to the invention, the design procedure starts with the noise transfer function NTF as is common for sigma-delta converter design. The design procedure comprises the following steps:

1. Define/design a desired (stable) noise transfer function NTF(z) with the additional criteria that it contains at least one damped zero. This criteria ensures that the resulting loop transfer function H(z) can be decomposed into components with damped response that can be implemented in a FIRDAC. Traditionally a NTF is chosen without considering the possibility of decomposition into components with damped response and therefore results in a loop transfer function which does not have transfer components that can be implemented in a FIRDAC.

2. Translate the noise transfer function into a loop transfer function H(z) using:

$$H = \frac{1}{NTF} - 1 = H_{ff} H_{fb}$$

3. From the transfer function H, extract the zeros and poles, corresponding to the roots of the numerator and denominator polynomial respectively.

4. Split the loop transfer function H into two parts $H_{ff}$ and $H_{fb}$, of which the product equals H again. $H_{ff}$ should contain all the undamped poles of H. It may further contain zeros and damped poles as desired. $H_{fb}$ should contain the remaining poles and zeros and should at least comprise at least one damped pole associated with one of said at least one damped zero.

5. Translate $H_{fb}$ to an impulse response (using normal linear-system theory) and take the first N coefficients of this impulse response to implement as finite impulse response (FIR) filter. This approach is possible because the poles for the FIRDAC are all damped which enables that their response can be approximated with a finite number of taps. N should be chosen large enough such that the actual FIRDAC transfer captures the dominant parts of $H_{fb}$ (N can be approximately equal to the time constant of the most low frequent pole of $H_{fb}$). The gain of the FIRDAC (the magnitude of the taps together) should be chosen such that the FIRDAC can reproduce the full range of intended input signals (with some over range to avoid overloading the sigma-delta modulation).

6. Optionally: appending the ADC with a digital filter having a transfer function $H_{cor}$ implementing the inverse signal transfer function given by:

$$H_{cor} = \frac{1 + H}{H_{ff}}$$

The present invention enables FIRDACs with a large number of coefficients to be used without conflicting with the stability criteria.

The implementation of the impulse response in FIR coefficients can easily result in a large number of FIR coefficients and thus resulting in a FIRDAC with a large number of coefficients. Following the design procedure above, this however will not lead to stability issues. This design procedure will result in a FIRDAC with low-pass characteristics, while still satisfying the Nyquist stability criteria in order to result a stable closed loop behaviour.

IMPLEMENTATION EXAMPLE

Figure 3A:
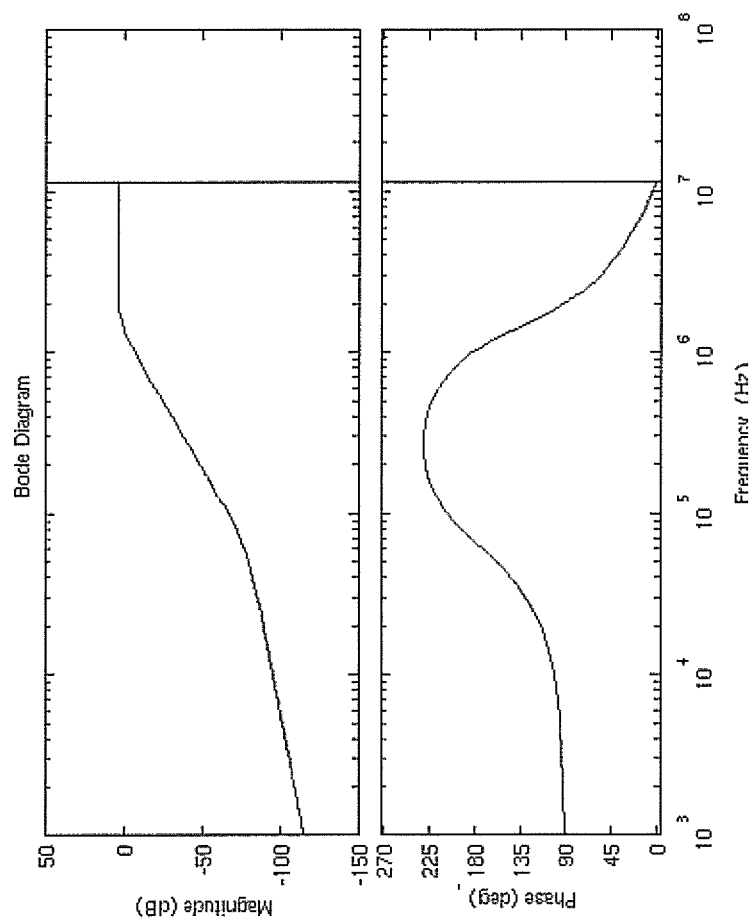
FIGS. 3A-3B illustrate bode plots of a possible NTF and H according to the invention, respectively.

The following relatively low (3rd) order IIR filter for the noise transfer function, of which a part is implemented in the FIR-filter, was used as starting point, see FIG. 3A:

$$NTF(z) = \frac{(z-1) \cdot (z^2 - 1.975z + 0.9756)}{(z - 0.6499) \cdot (z^2 - 1.519z + 0.6625)}$$

Figure 3B:
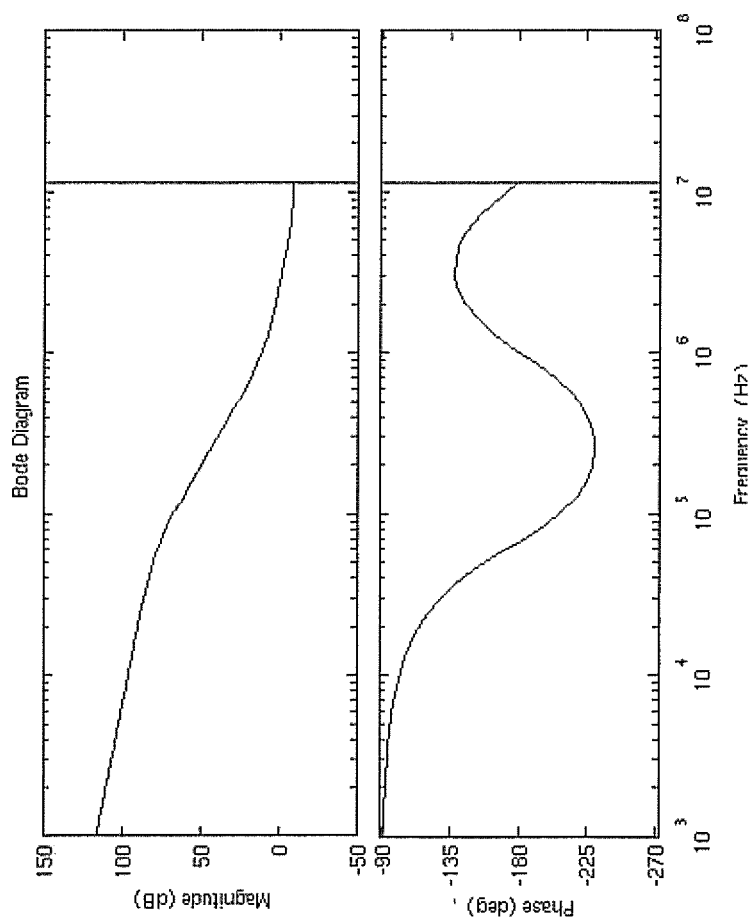

This noise transfer function is translated into a loop transfer function H, see FIG. 3B:

$$H(z) = \frac{0.80609 \cdot (z^2 - 1.614z + 0.6761)}{(z^2 - 1.975z + 0.9756) \cdot (z-1)}$$

The poles of this loop transfer function (the roots of the denominator of H) are:
1, 0.987+0.012i and 0.987−0.012i In this example, the first and only real pole is implemented as an integrator in the forward path. By this the first order of the 3rd order transfer function H is implemented.

Figure 4:
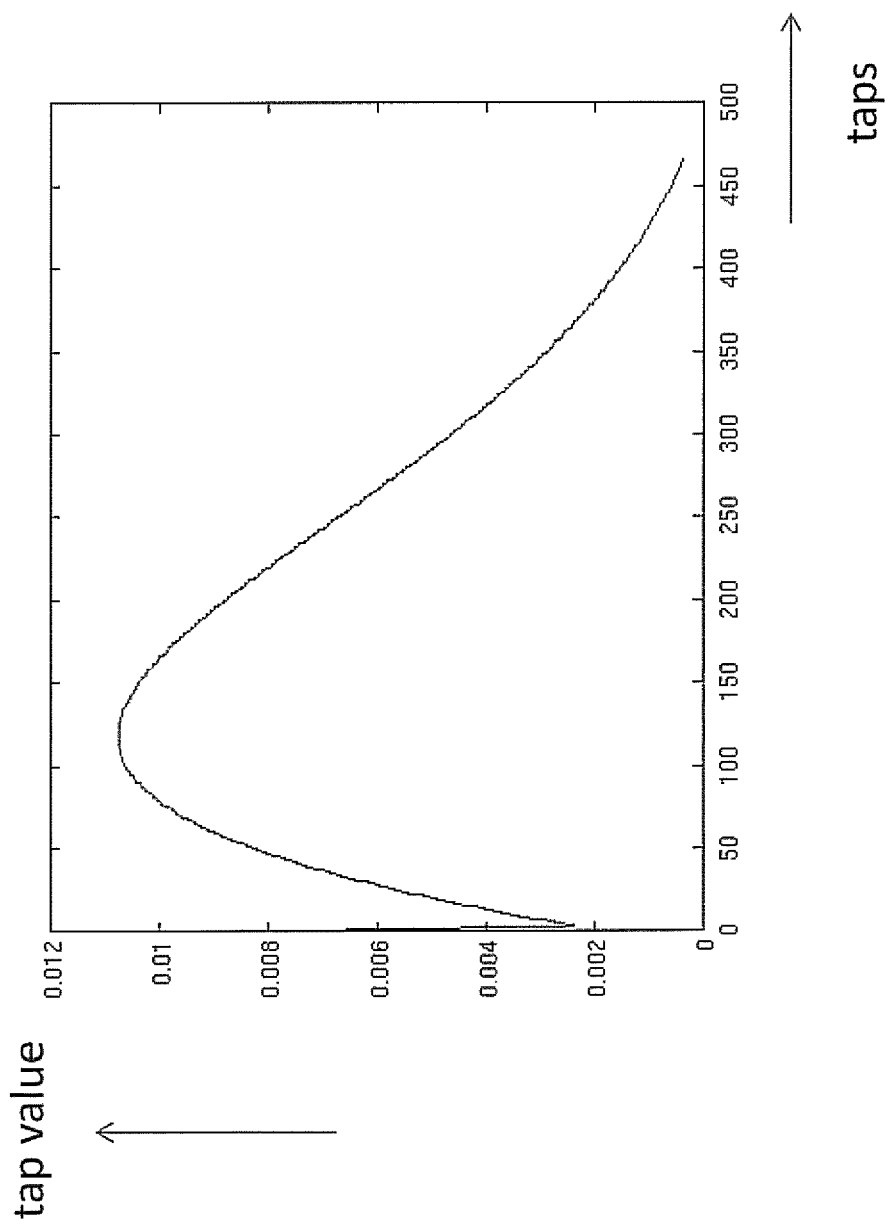
FIG. 4 depict the coefficients of a possible FIRDAC according to the invention.

In this example, the remaining two complex poles are damped poles and are implemented in the FIRDAC in the feedback path. The implementation is done by translation of the transfer function with the 2 poles and the zeros, i.e. 0.8070+0.1570i and 0.8070−0.1570i, to an impulse response. Only the first N coefficients of the impulse response are implemented by the FIR filter in the FIRDAC, see FIG. 4. N is chosen such that the transfer still highly resembles the desired transfer. In this example, the number of coefficients N is chosen 466. With this FIRDAC the remaining poles and zeros of the 3rd order transfer function H are implemented.

Figure 5A:
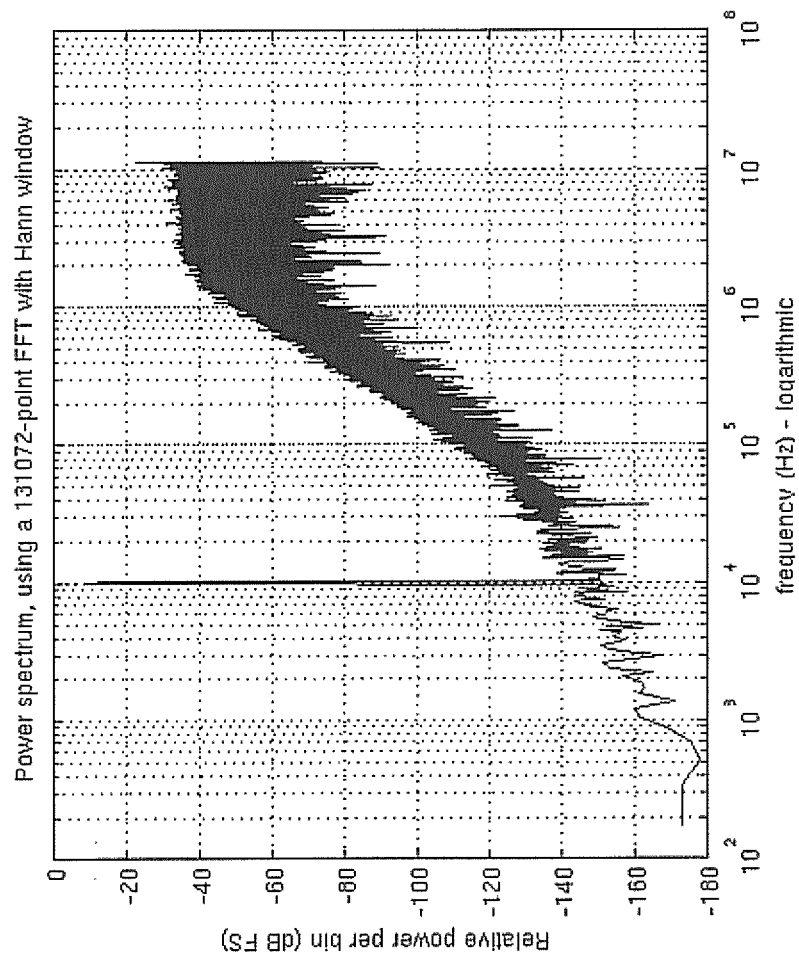
FIGS. 5A-5B show power spectral density plots of a possible ADC according to the invention before and after the correction filter, respectively.

The resulting output of this sigma-delta converter is illustrated using the power spectral density plot in FIG. 5A, where the output is directly taken at the output of the ADC, without compensation filter. From this figure, it can be deduced that the performance quantified by the signal-to-noise-and-distortion ratio (SNDR) equals 116 dB. In this plot a high out-of-band noise power is visible, typically for a one-bit sigma-delta modulator.

Figure 5B:
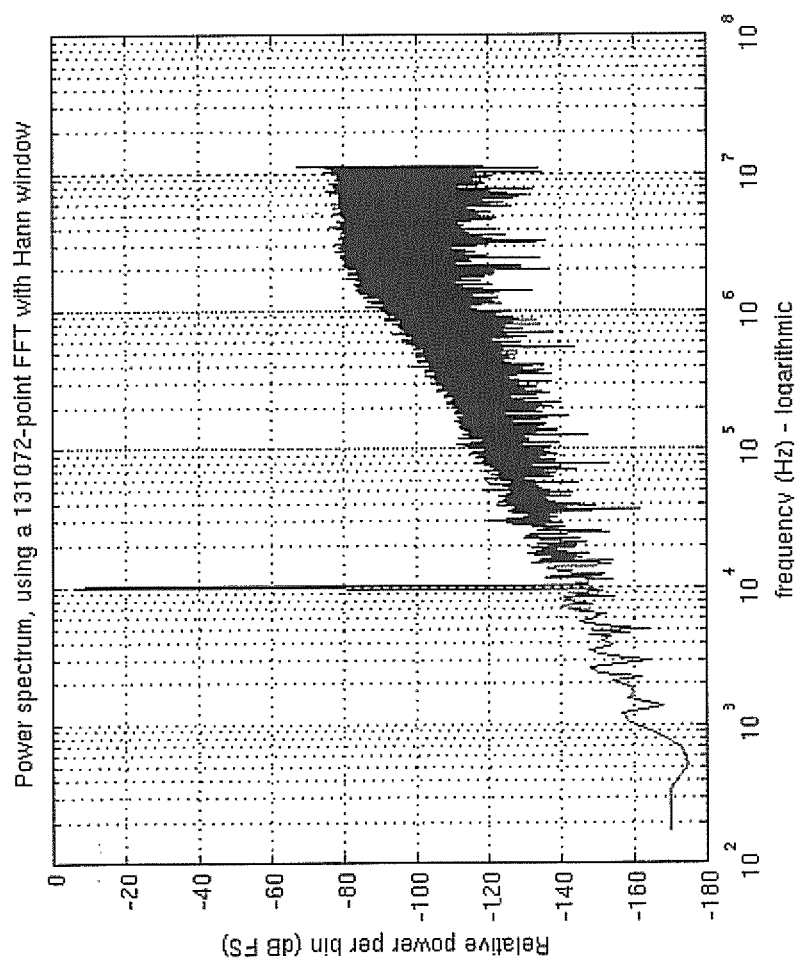

FIG. 5B again shows a power spectral density plot, but now with the output taken after a correction filter which corrects the transfer to get an overall in-/output transfer of substantially unity gain. From this figure it can be deduced that the out-of-band noise (~20 kHz to half the clock frequency) is highly suppressed (−45 dB) compared to a single bit sigma-delta modulator. It can also be deduced that the performance quantified by the signal-to-noise-and-distortion ratio (SNDR) still equals 116 dB.

The choices made in the design of this example have the following benefits:

1. The feed forward path is simple since it comprises only one integrator and one comparator, wherein the comparator output is only affected by the zero crossings of its input, which highly relaxes the requirements for the integrator. Linearity of the integrator, either the amplifier or the feedback capacitor comprising the integrator, is not important or only to a limited extent. As long as the charge balance is correct, since only zero crossing are detected by the 1 bit quantizer, neither errors nor negative effects will be seen in the system. Furthermore, a single bit comparator generates a single-bit data stream, which is perfectly linear by definition due to the fact that they have only two defined levels, unlike multi-bit quantizers, reflecting in system performance such as total harmonic distortion (THD) and SNDR.

2. The combination of the signal transfer of the ADC and the correction filter at its output is powerful. This combination features a unity gain transfer without phase shift, thus having low latency. This system further has low out-of-band noise and behaves as a multi-bit (>8 bit) converter. This is an important feature for application in closed-loop digital amplifiers.

3. High in-band resolution combined with low out-of-band noise and low latency make the ADC ideally suited for use in the feedback path of a closed loop system, such as a digital amplifier.

4. A single higher order FIRDAC with a large number of taps can be used without stability issues and thus without additional measures required to maintain stable.

5. The system with the FIRDAC enables a good jitter tolerance and a very high SNDR.

FIG. 6A illustrates the sigma-delta ADC of the present invention used in a digital control loop. This loop comprises a digital control algorithm 101 that controls its output based on a digital input and a digital feedback signal, a DAC 102 that converts the signal to a form suitable for the output, and the ADC according to the present invention 103.

Figure 6B:
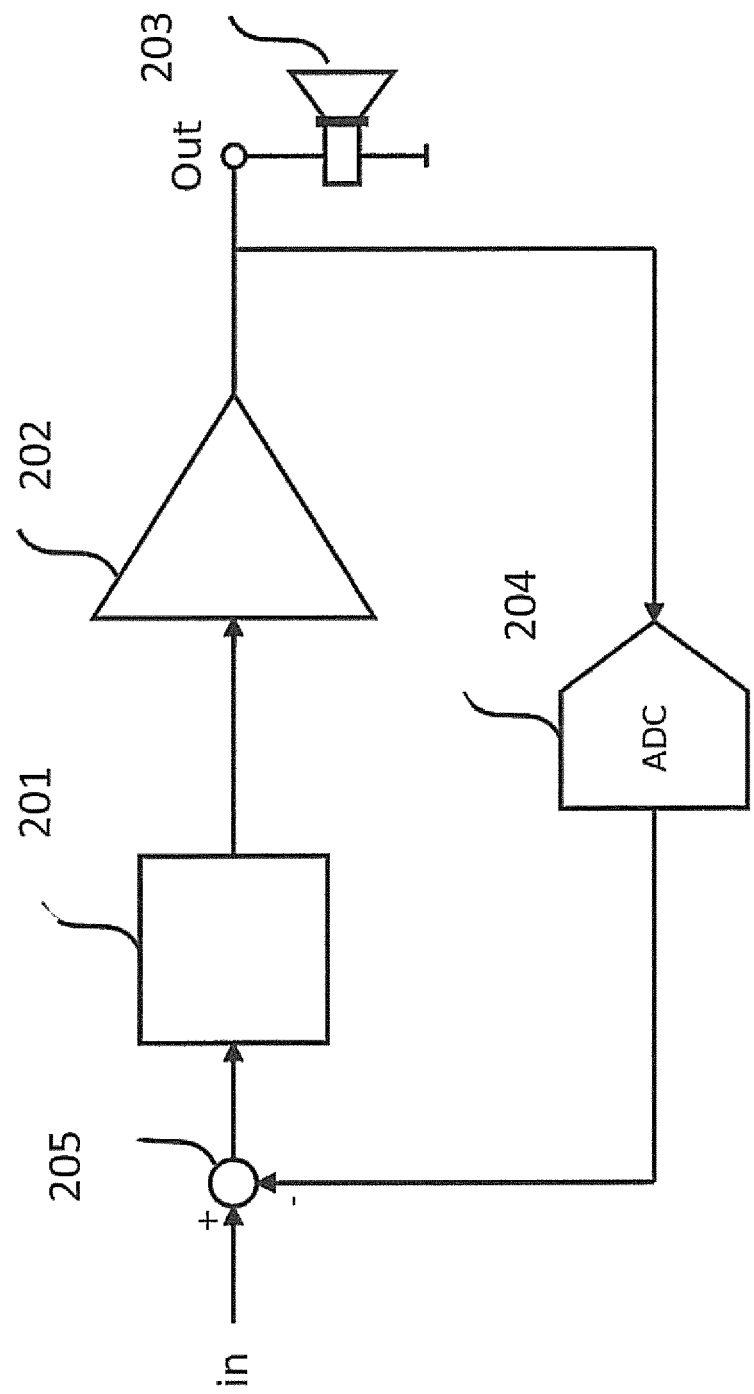

FIG. 6B illustrates the sigma-delta ADC of the present invention used in a digitally controlled audio amplifier. The amplifier comprises a filter 201 that controls its output based on the difference between a digital input signal and a digital feedback signal, an amplifier 202 that translates the digital input to an analog output with suitable power characteristics for the load, being a speaker 203, the ADC converter according to the present invention 204, and a summing junction 205 that generates a difference between the digital input signal and the digital feedback signal.

The invention has been described using embodiments thereof. It should be apparent to the skilled person that modifications to these embodiments are possible without deviating from the scope of the invention which is described by the appended claims.

The invention claimed is:

1. A sigma-delta analog-to-digital converter (ADC), comprising:
a first forward path connected to an input of the sigma-delta ADC comprising a filtering stage and a quantization stage, the first forward path having a transfer function $H_{ff}$;
a first feedback path from an output of the first forward path to the input of the sigma-delta ADC, said first feedback path comprising a digital-to-analog converter (DAC) and a digital filter for converting the output of the first forward path, said first feedback path having a transfer function $H_{fb}$;
wherein the sigma-delta ADC has a stable noise transfer function NTF given by:

$$NTF = \frac{1}{1 + H_{ff} H_{fb}} = \frac{1}{1 + H}$$

wherein H is the loop transfer function, said NTF having at least one damped zero;
wherein, if H comprises undamped poles, $H_{ff}$ comprising all the undamped poles of H, and wherein $H_{fb}$ comprises at least one damped pole associated with one of said at least one damped zero;
wherein the first feedback path comprises a finite impulse response (FIR) digital filter that has an impulse response that approximates the impulse response associated with $H_{fb}$, wherein the first N coefficients of the impulse response are implemented as said FIR filter, wherein N is at least equal to the time constant of the most low frequent pole of $H_{fb}$;

wherein the FIR digital filter is combined with the DAC for forming a finite impulse response digital-to-analog converter FIRDAC.

2. The sigma-delta ADC of claim 1, wherein $H_{fb}$ comprises a plurality of undamped poles.

3. The sigma-delta ADC of claim 1, further comprising a correction filter connected to the output of the first forward path.

4. The sigma-delta ADC of claim 3, said correction filter having a transfer function $H_{cor}$ substantially given by:

$$H_{cor} = \frac{1+H}{H_{ff}}.$$

5. The sigma-delta ADC of claim 1, wherein a signal band of interest is contained within the pass-band of both $H_{ff}$ and $H_{fb}$.

6. The sigma-delta ADC of claim 1, wherein both $H_{ff}$ and $H_{fb}$ have low-pass characteristics.

7. The sigma-delta ADC of claim 1, wherein the filtering stage comprises a passive filter.

8. The sigma-delta ADC of claim 1, wherein the filtering stage comprises a plurality of passive filters and/or a plurality of integrators.

9. The sigma-delta ADC of claim 1, comprising only a single integrator in the filtering stage.

10. A digital control loop, comprising:
a second forward path connected to an input of the digital control loop comprising an amplifier for amplifying a difference between a digital input signal and a second digital signal and for converting the amplified signal into an analog output signal; and
a second feedback path from an output of said second forward path to the input of the digital control loop, said second feedback path comprising the sigma-delta ADC as defined in claim 1 for converting the analog output signal into said second digital signal.

11. A digital audio amplifier comprising the digital control loop as defined in claim 10 for driving a speaker, when connected to the digital audio amplifier, in accordance with the digital input signal.

12. A method for designing a sigma-delta analog-to-digital converter (ADC) comprising a forward path connected to an input of the sigma-delta ADC comprising a filtering stage and a quantization stage, the forward path having a transfer function $F_{ff}$, a feedback path from an output of the forward path to the input of the sigma-delta ADC, said feedback path comprising a digital-to-analog converter (DAC) and a digital filter for converting the output of the forward path, said feedback path having a transfer function $H_{fb}$, wherein the sigma-delta ADC has a stable noise transfer function NTF given by:

$$NTF = \frac{1}{1+H_{ff}H_{fb}} = \frac{1}{1+H}$$

wherein H is the loop transfer function, said NTF having at least one damped zero, wherein, if H comprises undamped poles, $H_{ff}$ comprising all the undamped poles of H, and wherein $H_{fb}$ comprises at least one damped pole associated with one of said at least one damped zero, wherein the feedback path comprises a finite impulse response (FIR) digital filter that has an impulse response that approximates the impulse response associated with $H_{fb}$, wherein the first N coefficients of the impulse response are implemented as said FIR filter, wherein N is at least equal to the time constant of the most low frequent pole of $H_{fb}$, wherein the FIR digital filter is combined with the DAC for forming a finite impulse response digital-to-analog converter FIRDAC, the method comprising:

defining a desired stable noise transfer function NTF of the sigma-delta ADC that comprises at least one damped zero;

translating NTF into a loop transfer function H of the sigma-delta ADC according to:

$$H = \frac{1}{NTF} - 1 = H_{ff}H_{fb}$$

extracting poles and zeros of H;

splitting H into $H_{ff}$ and $H_{fb}$, wherein, if H comprises undamped poles, $H_{ff}$ comprising all said undamped poles of H, and wherein $H_{fb}$ comprises at least one damped pole associated with one of said at least one damped zero;

approximating an impulse response associated with $H_{fb}$ with a finite impulse response, and implementing said finite impulse response with a finite impulse response (FIR) filter;

wherein the first N coefficients of the impulse response are implemented as said FIR filter, wherein N is at least equal to the time constant of the most low frequent pole of $H_{fb}$;

wherein the FIR digital filter is combined with the DAC or forming a finite impulse response digital-to-analog converter FIRDAC.

13. The method according to claim 12, further comprising correcting an output of the forward path using a correction filter connected to the output of the forward path.

14. The method according to claim 13, wherein the correction filter has a transfer function $H_{cor}$ substantially given by:

$$H_{cor} = \frac{1+H}{H_{ff}}.$$

15. A method for manufacturing a sigma-delta analog-to-digital converter (ADC), comprising:
designing the ADC according to claim 12; and
manufacturing the ADC according to the design of the ADC.

* * * * *